United States Patent [19]
Crocker

[11] Patent Number: 5,773,995
[45] Date of Patent: Jun. 30, 1998

[54] DIGITAL MULTIPLEXER CIRCUIT

[75] Inventor: Paul R. Crocker, Austin, Tex.

[73] Assignee: Motorola, Inc., Schaumburg, Ill.

[21] Appl. No.: 636,084

[22] Filed: Apr. 22, 1996

[51] Int. Cl.$^6$ ................................................ H03K 19/084
[52] U.S. Cl. ........................................... 326/108; 326/106
[58] Field of Search ..................................... 326/108, 106, 326/105

[56] References Cited

U.S. PATENT DOCUMENTS

| | | | |
|---|---|---|---|
| 4,575,812 | 3/1986 | Kloker et al. | 364/760 |
| 4,916,336 | 4/1990 | Houston | 326/108 |
| 4,975,597 | 12/1990 | Houston | 326/108 |
| 5,221,865 | 6/1993 | Phillips et al. | 326/86 |
| 5,327,022 | 7/1994 | Yamada et al. | 326/106 |
| 5,410,192 | 4/1995 | Yamada | 326/106 |
| 5,534,798 | 7/1996 | Phillips et al. | 326/108 |

OTHER PUBLICATIONS

C. Piguet, "Ultra Low Power Digital Design," Apr. 17–21, 1995, Santa–Clara, CA, USA; Jun. 26–30, 1995, Lausanne, Switzerland, pp. 1–23.

*Primary Examiner*—Edward P. Westin
*Assistant Examiner*—Richard Roseen

[57] ABSTRACT

A multiplexer circuit (100) having N data inputs (151, 152, 156) is operable for outputting one of the received N data inputs (151, 152, 156) to its data output (150) in response to receipt of a plurality of control signals (144), which are produced by encoding (143) the selection signals (145) typically implemented for controlling such a multiplexer circuit (100).

22 Claims, 11 Drawing Sheets

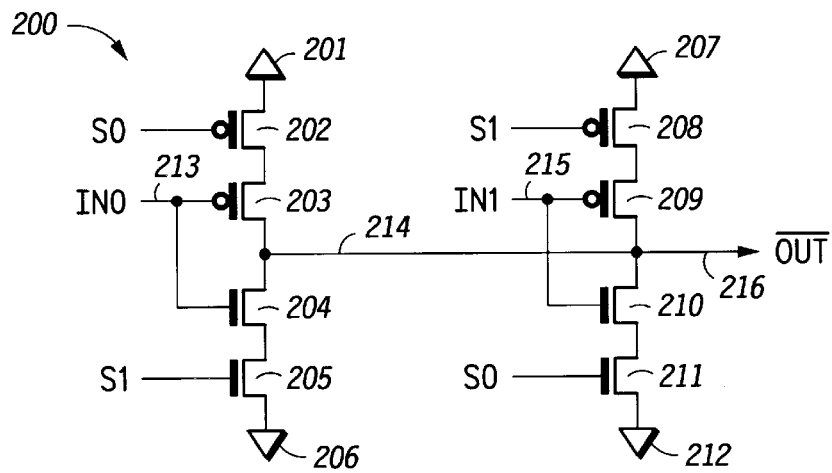
*FIG.2*
*FIG.3*
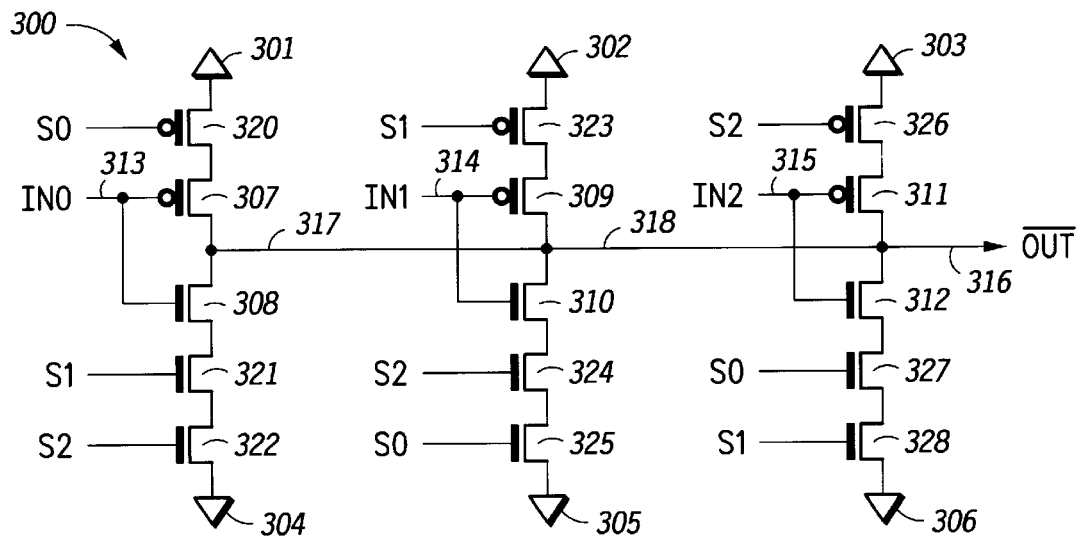
*FIG.4*
*FIG.5*

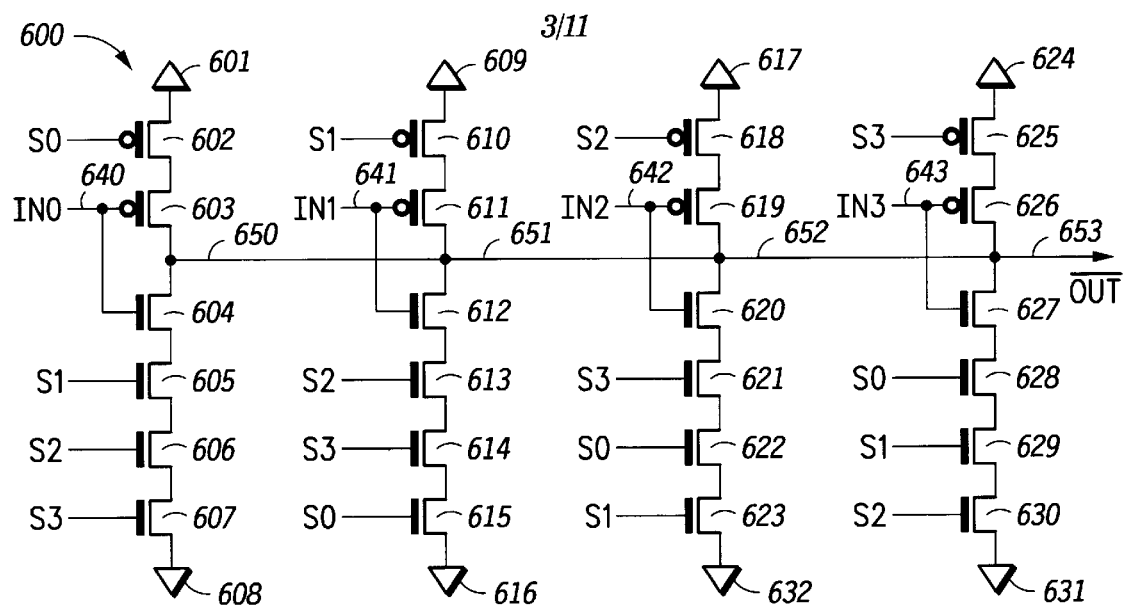
FIG.6
FIG.7
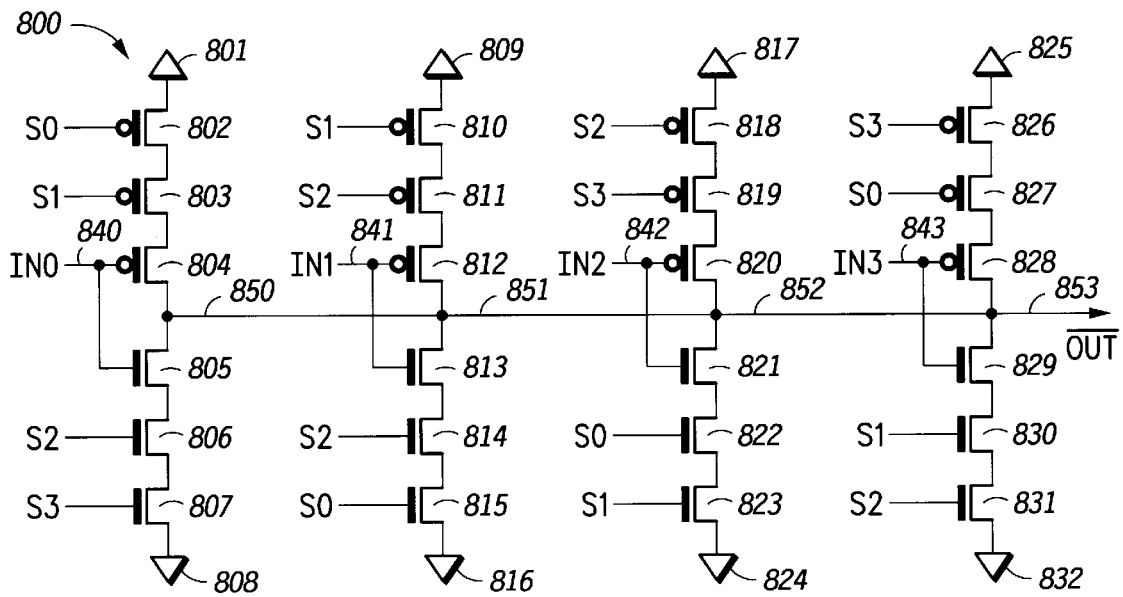
FIG.8

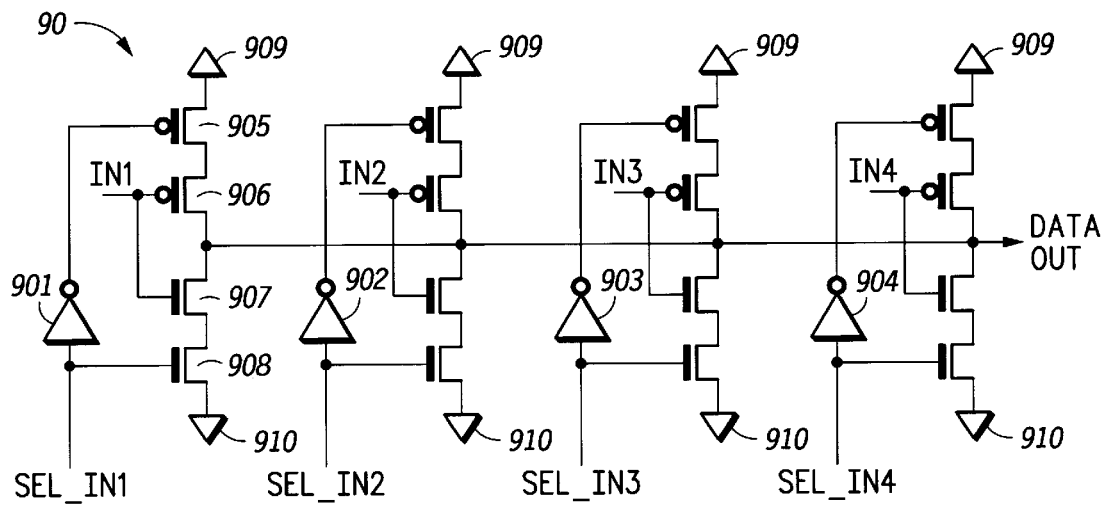
FIG.9
-PRIOR ART-
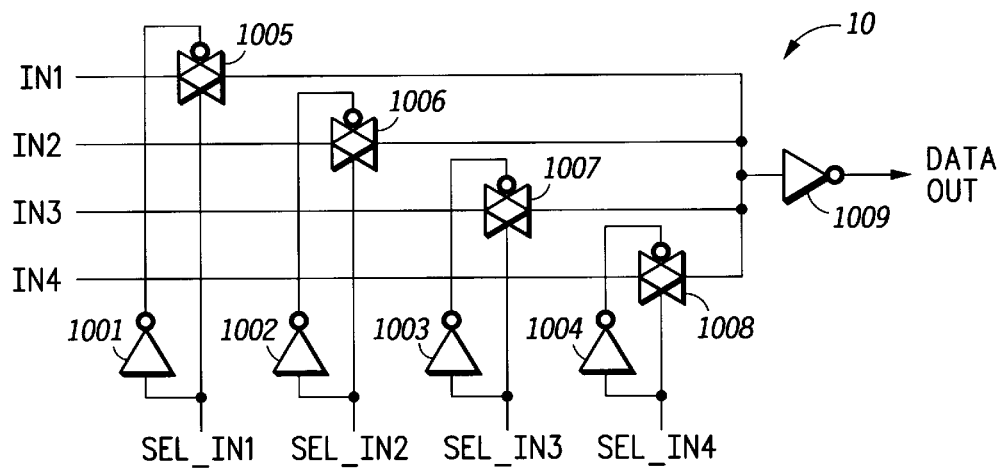
FIG.10
-PRIOR ART-
|         | S0 | S1 | S2 | S3 |
|---------|----|----|----|----|
| SEL_IN0 | 0  | 0  | 1  | 1  |
| SEL_IN1 | 1  | 0  | 0  | 1  |
| SEL_IN2 | 1  | 1  | 0  | 0  |
| SEL_IN3 | 0  | 1  | 1  | 0  |
FIG.11

| | S0 | S1 | S2 | S3 | S4 | S5 |
|---|---|---|---|---|---|---|
| SEL_IN0 | 0 | 0 | 1 | 1 | 0 | 1 |
| SEL_IN1 | 1 | 0 | 0 | 1 | 1 | 0 |
| SEL_IN2 | 0 | 1 | 0 | 0 | 1 | 1 |
| SEL_IN3 | 1 | 0 | 1 | 0 | 0 | 1 |
| SEL_IN4 | 0 | 1 | 0 | 1 | 0 | 0 |
| SEL_IN5 | 1 | 0 | 1 | 0 | 1 | 0 |

| | S0 | S1 | S2 | S3 | S4 | S5 |
|---|---|---|---|---|---|---|
| SEL_INN-5 | 0 | 1 | 0 | 1 | 0 | 1 |
| SEL_INN-4 | 1 | 0 | 1 | 0 | 1 | 0 |
| SEL_INN-3 | 0 | 1 | 0 | 1 | 0 | 1 |
| SEL_INN-2 | 1 | 0 | 1 | 0 | 1 | 0 |
| SEL_INN-1 | 1 | 1 | 0 | 1 | 0 | 1 |
| SEL_INN | 0 | 1 | 1 | 0 | 1 | 0 |

| | SN-5 | SN-4 | SN-3 | SN-2 | SN-1 | SN |
|---|---|---|---|---|---|---|
| SEL_IN0 | 0 | 1 | 0 | 1 | 0 | 1 |
| SEL_IN1 | 1 | 0 | 1 | 0 | 1 | 0 |
| SEL_IN2 | 0 | 1 | 0 | 1 | 0 | 1 |
| SEL_IN3 | 1 | 0 | 1 | 0 | 1 | 0 |
| SEL_IN4 | 0 | 1 | 0 | 1 | 0 | 1 |
| SEL_IN5 | 1 | 0 | 1 | 0 | 1 | 0 |

| | SN-5 | SN-4 | SN-3 | SN-2 | SN-1 | SN |
|---|---|---|---|---|---|---|
| SEL_INN-5 | 0 | 0 | 1 | 1 | 0 | 1 |
| SEL_INN-4 | 1 | 1 | 0 | 1 | 1 | 0 |
| SEL_INN-3 | 0 | 1 | 1 | 0 | 0 | 1 |
| SEL_INN-2 | 1 | 0 | 0 | 0 | 1 | 1 |
| SEL_INN-1 | 0 | 1 | 1 | 1 | 0 | 0 |
| SEL_INN | 1 | 0 | 0 | 0 | 1 | 0 |

| | S0 | S1 | S2 | S3 | S4 | S5 | S6 |
|---|---|---|---|---|---|---|---|
| SEL_IN0 | 1 | 0 | 0 | 1 | 0 | 1 | 0 |
| SEL_IN1 | 0 | 1 | 0 | 0 | 1 | 0 | 1 |
| SEL_IN2 | 1 | 0 | 1 | 0 | 0 | 1 | 0 |
| SEL_IN3 | 0 | 1 | 0 | 1 | 0 | 0 | 1 |
| SEL_IN4 | 1 | 0 | 1 | 0 | 1 | 0 | 0 |
| SEL_IN5 | 0 | 1 | 0 | 1 | 0 | 1 | 1 |
| SEL_IN6 | 1 | 0 | 1 | 0 | 1 | 0 | 1 |

| | SN-6 | SN-5 | SN-4 | SN-3 | SN-2 | SN-1 | SN |
|---|---|---|---|---|---|---|---|
| SEL_INN-6 | 0 | 1 | 0 | 1 | 0 | 1 | 0 |
| SEL_INN-5 | 1 | 0 | 1 | 0 | 1 | 0 | 1 |
| SEL_INN-4 | 0 | 1 | 1 | 0 | 1 | 0 | 0 |
| SEL_INN-3 | 1 | 0 | 0 | 1 | 0 | 1 | 1 |
| SEL_INN-2 | 0 | 0 | 1 | 0 | 1 | 0 | 0 |
| SEL_INN-1 | 1 | 1 | 0 | 1 | 0 | 1 | 0 |
| SEL_INN | 0 | 0 | 1 | 0 | 1 | 0 | 1 |

|         | S0 | S1 | S2 | S3 | S4 | S5 |
|---------|----|----|----|----|----|----|
| SEL_IN0 | 0  | 1  | 1  | 1  | 0  | 1  |
| SEL_IN1 | 1  | 0  | 1  | 1  | 0  | 1  |
| SEL_IN2 | 1  | 1  | 0  | 1  | 0  | 1  |
| SEL_IN3 | 1  | 1  | 1  | 0  | 0  | 1  |
| SEL_IN4 | 0  | 1  | 1  | 1  | 1  | 0  |
| SEL_IN5 | 1  | 0  | 1  | 1  | 1  | 0  |
| SEL_IN6 | 1  | 1  | 0  | 1  | 1  | 0  |
| SEL_IN7 | 1  | 1  | 1  | 0  | 1  | 0  |

5,773,995

DIGITAL MULTIPLEXER CIRCUIT

FIELD OF THE INVENTION

The present invention relates in general to digital multiplexers, and in particular, to an encoding of selection signals before input to a digital multiplexer circuit.

BACKGROUND OF THE INVENTION

Digital multiplexers are very common within integrated circuits such as microprocessors and digital signal processors. Essentially, a multiplexer is a circuit that outputs one of several received data signals in response to received selection signals.

One of the problems associated with the use of multiplexers in an integrated circuit is that the routing area required by the numerous relations signals can often become very large. This problem is further magnified when a multiplexer is part of an array of multiplexers in a data path.

For example, referring to FIG. 9, there is shown prior art multiplexer 90 using clocked inverters to receive data input signals. Illustrated are four stages receiving data input signals IN1, IN2, IN3, IN4. A first stage of four-stage multiplexer 90 has an inverter comprised of PFET (P-channel field-effect transistor) 906 and NFET (N-channel field-effect transistor) 907 receiving input data signal IN1. To the source electrode of PFET 906 is coupled the drain electrode of PFET 905, which has its source electrode coupled to reference voltage source 909. The source electrode of NFET 907 is coupled to the drain electrode of NFET 908, which has its source electrode coupled to the reference voltage source 910. The gate electrode of NFET 908 receives selection signal SEL_IN1, while the gate electrode of PFET 905 receives an inverse of SEL_IN1 produced by inverter 901. The other three stages of the four-stage multiplexer 90 shown in FIG. 9 are configured similarly to the first stage.

Multiplexer 90 operates by outputting as Data Out one of the received input signals IN1, IN2, IN3, or IN4, depending on which stage receives an asserted selection signal. For example, data input signal IN3 will be output from four-stage multiplexer 90 if SEL_IN3 is asserted.

Referring to FIG. 10, there is shown another prior art multiplexer circuit 10 receiving the four input data signals IN1, IN2, IN3, and IN4 in response to receipt of the selection signals SEL_IN1, SEL_IN2, SEL_IN3 and SEL_IN4. Operation of multiplexer circuit 10 is performed by transmission gates 1005–1008, each receiving one of the selection signals and its inverse signal, which is produced for each stage by inverters 1001–1004, respectively. Whichever data input signal is selected to be output as Data Out will pass through inverter 1009.

The problem with the foregoing prior art multiplexer circuits 90 and 10 shown in FIGS. 9 and 10, respectively, is that their layout is large and cumbersome, typically requiring a large volume and corresponding layout area of transmission lines for routing the selection signals SEL_IN1, SEL_IN2, SEL_IN3, SEL_IN4 to each of the stages of the multiplexer. Furthermore, the use of local inverters 901–904 and 1001–1004 in multiplexer circuits 90 and 10, respectively, results in (1) an increase in cell size for each multiplexer circuit, and (2) two gate delays for operations of the multiplexer.

Furthermore, multiplexer circuit 90 is susceptible to shunting of current between the two reference voltages 909 and 910 supplied to each of the stages. This may occur when the timing of two or more of the received selection signals is skewed due to the various paths through which they must travel within the combinatorial logic circuitry supplying such selection signals. For example, SEL_IN1 and SEL_IN2 may be asserted at the same time when supplied to the first two stages of multiplexer circuit 90. In such an instance, both these stages will be activated resulting in a shunt path from voltage reference source 909 of the first stage to voltage reference source 910 of the second stage.

As a result of the foregoing, there is a need in the art for improved multiplexer circuits which address the foregoing problems.

BRIEF DESCRIPTION OF THE DRAWINGS

For a more complete understanding of the present invention, and the advantages thereof, reference is now made to the following descriptions taken in conjunction with the accompanying drawings, in which:

FIG. 2 illustrates a two-input multiplexer circuit in accordance with the present invention;

FIG. 3 illustrates an encoding table for encoding the control signals supplied to the two-input multiplexer circuit illustrated in FIG. 2;

FIG. 4 illustrates a three-input multiplexer circuit in accordance with the present invention;

FIG. 5 illustrates an encoding table for encoding the control signals supplied to the three-input multiplexer circuit illustrated in FIG. 4;

FIG. 6 illustrates a four-input asymmetric multiplexer circuit in accordance with the present invention;

FIG. 7 illustrates encoding of the control signals for the four-input asymmetric multiplexer circuit illustrated in FIG. 6;

FIG. 8 illustrates a four-input symmetric multiplexer circuit in accordance with the present invention;

FIG. 9 illustrates a prior art multiplexer circuit;

FIG. 10 illustrates another prior art multiplexer circuit;

FIG. 11 illustrates encoding of the control signals for the four-input symmetric multiplexer circuit illustrated in FIG. 8;

FIG. 16 illustrates encoding of the signals to be sent to an (N+1)-input multiplexer circuit where (N+1) is an even integer;

FIG. 17 illustrates encoding of signals to be sent to an (N+1)-input multiplexer circuit where (N+1) is an odd integer;

DESCRIPTION OF THE PREFERRED EMBODIMENTS

Figure 1:
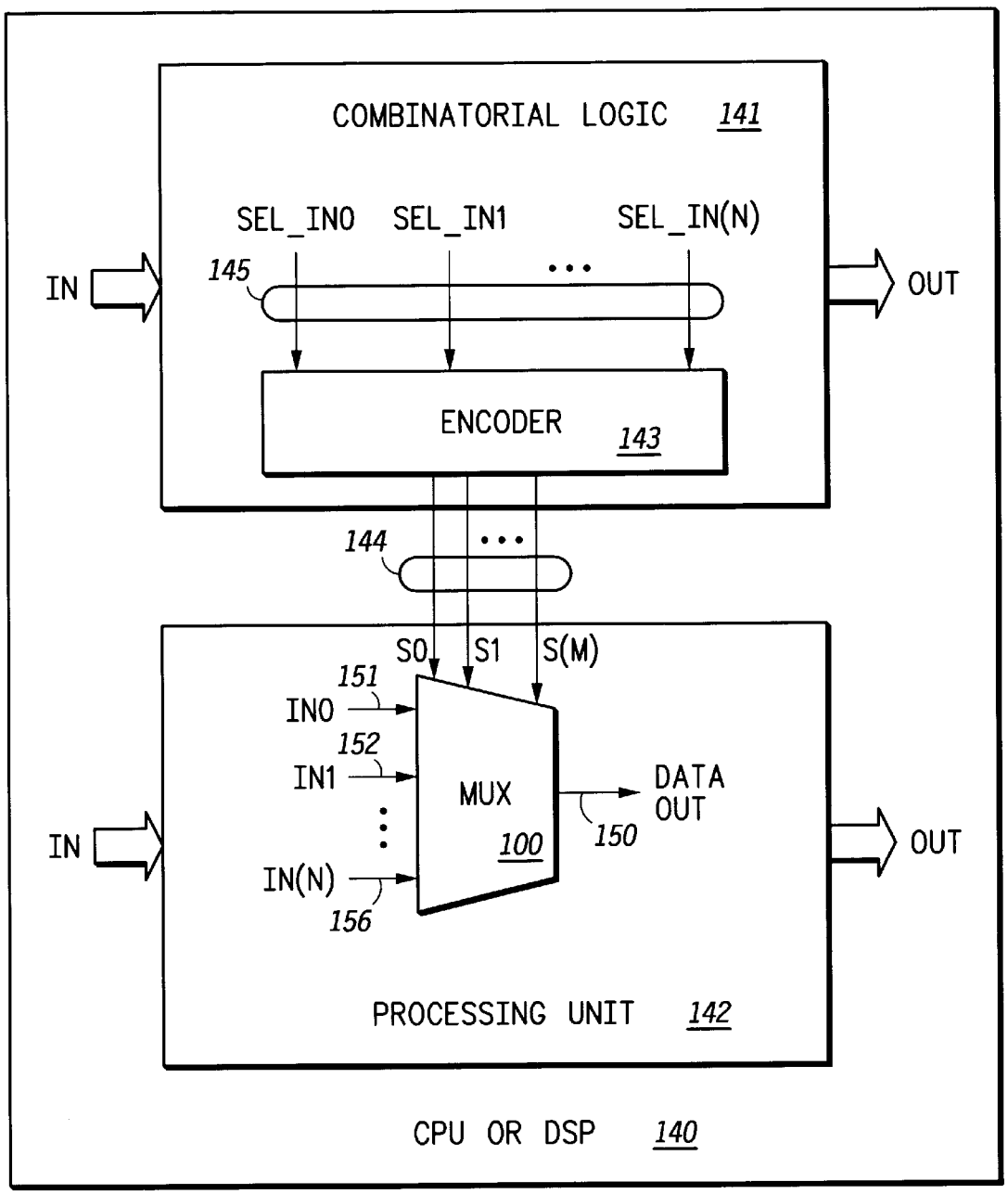
FIG. 1 illustrates an implementation of a multiplexer circuit of the present invention within any type of integrated circuit, including a CPU or DSP chip.

In the following description, numerous specific details are set forth to provide a thorough understanding of the present invention. However, it will be obvious to those skilled in the art that the present invention may be practiced without such specific details. In other instances, well-known circuits have been shown in block diagram form in order not to obscure the present invention in unnecessary detail. For the most part, details concerning timing considerations and the like have been omitted inasmuch as such details are not necessary to obtain a complete understanding of the present invention and are within the skills of persons of ordinary skill in the relevant art.

Refer now to the drawings wherein depicted elements are not necessarily shown to scale and wherein like or similar elements are designated by the same reference numeral through the several views.

Referring to FIG. 1, there is illustrated an example implementation of the various multiplexer circuits described below with respect to FIGS. 2–8 and 11–20 in accordance with the present invention. In one embodiment, multiplexer circuit 100 may be included within circuitry in one of various units within a central processing unit (CPU) or digital signal processor (DSP) 140, such as processing unit (data path) 142, which may be an execution unit or a multiply-accumulate circuit. The present invention may be implemented with respect to any data path within any type of integrated circuit that utilizes a multiplexing function.

Operation of multiplexer circuit 100 is in response to selection signals SEL_IN0, SEL_IN1, . . . , SEL_IN(N) produced by combinatorial logic circuitry 141. The present invention also includes encoder 143 for encoding selection signals SEL_IN0, SEL_IN1, . . . , SEL_IN(N) into control signals S0, S1, . . . , S(M), and transmitting these to multiplexer circuit 100 over control lines 144. Encoder 143 receives selection signals SEL_IN0, SEL_IN1, . . . , SEL_IN(N) over input lines 145. Encoder 143 may be implemented within combinatorial logic circuitry 141, or may be implemented within processing unit 142 along with multiplexer circuit 100.

The number (M+1) of control lines 144 may be the same as or less than the number (N+1) of input lines 145 ((M+1)≦(N+1)), i.e., the number of selection signals SEL_IN0, SEL_IN1, . . . , SEL_IN(N) may be the same as or more than the number of control signals S0, S1, . . . , S(M). However, (M+1) may be greater than (N+1).

One of the advantages of the present invention is that the use of local inverters at multiplexer circuit 100 is eliminated (see discussion above with respect to FIGS. 9 and 10).

In some prior art implementations, such local inverters have been implemented within combinatorial logic circuitry 141 requiring twice as many control lines to be routed from combinatorial logic circuitry 141 to multiplexer circuit 100 within processing unit 142. In such a case, twice as much routing area is required. Because of the elimination of the local inverters by the present invention, routing area is reduced, since the number of control lines 144 is reduced by at least one-half.

Referring next to FIG. 2, there is illustrated multiplexer circuit 200 operable for receiving two data input signals IN0 and IN1 on inputs 213 and 215, respectively, and outputting on output 216 a data output signal, labeled as $\overline{OUT}$, in response to receipt of encoded signals S0 and S1. Data input signal IN0 is received by the gate electrodes of PFET (P-channel field effect transistor) 203 and NFET (N-channel field effect transistor) 204, which comprise a clocked inverter circuit having an output 214, which is coupled to output 216. Data input signal IN1 is received by the gate electrodes of PFET 209 and NFET 210, which comprise a clocked inverter having an output 216. The source electrode of PFET 203 is coupled to the drain electrode of PFET 202, which has its source electrode coupled to reference voltage source 201. The gate electrode of PFET 202 receives encoded signal S0. The source electrode of NFET 204 is coupled to the drain electrode of NFET 205, which has its source electrode coupled to reference voltage source 206. The gate electrode of NFET 205 receives encoded signal S1.

Likewise, the source electrode of PFET 209 is coupled to the drain electrode of PFET 208, which has its source electrode coupled to reference voltage source 207. The gate electrode of PFET 208 receives encoded signal S1. The source electrode of NFET 210 is coupled to the drain electrode of NFET 211, which has its source electrode coupled to reference voltage source 212. The gate electrode of NFET 211 receives encoded signal S0.

Reference voltage sources 201 and 207 may be coupled. Reference voltage sources 206 and 212 may also be coupled. Reference voltage sources 201 and 207 may be coupled to a positive or negative power supply, while reference voltage sources 206 and 212 may be coupled to a ground reference. Voltage sources 201, 207 will have higher potentials than voltage sources 206, 212.

Referring next to FIG. 3, there is illustrated a table for encoding encoded signals S0 and S1 as a function of selection signals SEL_IN0 and SEL_IN1. The encoding shown in the table of FIG. 3 is implemented in logic circuitry (not shown) within encoder 143. Thus, encoder 143 receives selection signals SEL_IN0 and SEL_IN1 and produces encoded signals S0 and S1 in accordance with the table of FIG. 3. These encoded signals are then utilized to operate multiplexer circuit 200.

Note, alternative methods for encoding encoded signals S0 and S1 may be produced by generation of an alternative table of values with the following rules for generating the table:

1. Each row contains one 1 and one 0.
2. The column containing the designating 1 on a row does not contain a 1 on another row.
3. The column containing the designating 0 on a row does not contain a 0 on another row.

A designating 1 and a designating 0 in each row denote the number of NFETs and PFETs, respectively, for a corresponding stage within the logic circuitry implemented by the encoding table.

Note, selection signals SEL_IN0 and SEL_IN1 are the typical selection signals produced by circuitry such as combinatorial logic circuitry 141 for operating a multiplexer circuit such as in the manner described above with respect to FIGS. 9 and 10. Thus, an assertion of selection signal SEL_IN0 is produced by combinatorial logic circuitry 141 in order to cause multiplexer circuit 200 to select for output on output 216 a data signal that is a function of received input data signal IN0. An assertion of selection signal SEL_IN1 is intended to cause multiplexer circuit 200 to select for output on output 216 a signal that is a function of the received input data signal IN1.

However, encoder 143 intervenes and receives selection signals SEL_IN0 and SEL_IN1 and encodes these signals in accordance with the table of FIG. 3 to produce encoded signals S0 and S1, which are then transmitted to multiplexer circuit 200 to cause multiplexer circuit 200 to operate in the intended manner described above. One of the advantages of utilizing the encoded signals is that multiplexer circuit 200 has only one gate delay for its operation. Another advantage is that it is not possible to generate a shunt path between reference voltage source 201 (207) and reference voltage source 212 (206). Furthermore, another advantage of multiplexer circuit 200 is that it does not require the use of local inverters as do circuits 90 and 10 in FIGS. 9 and 10, respectively.

Referring next to FIG. 4, there is shown 3-input multiplexer 300 operable for outputting an output data signal, labeled as $\overline{\text{OUT}}$, on line 316, which is coupled to lines 317 and 318, in response to receipt of input data signals IN0, IN1, and IN2. Data input signal IN0 is received by line 313, which is coupled to the gate electrodes of PFET 307 and NFET 308, which form a clocked inverter having an output 317. Data input signal IN1 is received by line 314, which is coupled to the gate electrodes of PFET 309 and NFET 310, which form a clocked inverter having an output 318. Input data signal IN2 is received by line 315, which is coupled to the gate electrodes of PFET 311 and NFET 312, which form an inverter having an output 316. Outputs 316–318 are coupled together.

The source electrode of PFET 307 is coupled to the drain electrode of PFET 320, which has its source electrode coupled to reference voltage source 301. The gate electrode of PFET 320 receives control signal S0. The source electrode of NFET 308 is coupled to the drain electrode of NFET 321, which has its source electrode coupled to the drain electrode of NFET 322, which has its source electrode coupled to reference voltage source 304. The gate electrode of NFET 321 receives control signal S1, while the gate electrode of NFET 322 receives control signal S2.

The source electrode of PFET 309 is coupled to the drain electrode of PFET 323, which has its source electrode coupled to reference voltage source 302. The gate electrode of PFET 323 receives control signal S1. The source electrode of NFET 310 is coupled to the drain electrode of NFET 324, which has its source electrode coupled to the drain electrode of NFET 325, which has its source electrode coupled to reference voltage source 305. The gate electrode of NFET 325 receives control signal S0, while the gate electrode of NFET 324 receives control signal S2.

The source electrode of PFET 311 is coupled to the drain electrode of PFET 326, which has its source electrode coupled to reference voltage source 303. The gate electrode of PFET 326 receives control signal S2. The source electrode of NFET 312 is coupled to the drain electrode of NFET 327, which has its source electrode coupled to the drain electrode of NFET 328, which has its source electrode coupled to reference voltage source 306. The gate electrode of NFET 328 receives control signal S1, while the gate electrode of NFET 327 receives control signal S0.

Reference voltage sources 301–303 may be coupled together. Likewise, reference voltage sources 304–306 may be coupled together. Reference voltage sources 301–303 may be coupled to a positive or negative power supply, while reference voltage sources 304–306 may be coupled to a ground reference. Voltage sources 301–303 will have higher potentials than sources 304–306.

Control signals S0, S1, and S2 are produced by encoder 143 in response to receipt of selection signals SEL_IN0, SEL_IN1, and SEL_IN2, in accordance with the table illustrated in FIG. 5.

Note, multiplexer circuit 300 could be alternatively designed so that each stage of circuit 300 has two PFET devices receiving control signals and one NFET device receiving a control signal. In such a case, the encoding table will be different. A stage comprises a clocked inverter receiving an encoded signal, and the adjoining FET devices coupling the clocked inverter to the two reference voltage sources. For example, the first stage of multiplexer circuit 300 comprises reference voltage sources 301 and 304, the inverter comprised of PFET 307 and NFET 308, and PFET 320 and NFETs 321, 322. A branch of a stage comprises one end of a stage. For example, one branch of the first stage of multiplexer 300 comprises PFETs 320 and 307 and reference voltage source 301, while the second branch of the first stage of multiplexer circuit 300 comprises NFETs 308 and 321–322 and reference voltage source 304. Note that the ordering of the transistors in a branch may be changed and still produce the same logical results.

As noted above, alternative designs for circuit 300 may be implemented. When producing the encoding table for such an alternative design, the following rules are followed:

1. Each row contains two 1s and one 0.
2. The columns containing the designating 1s on a particular row do not both contain 1s on another row.
3. The column containing the designating 0 on a particular row does not contain a 0 on another row.

Referring next to FIG. 6, there is illustrated multiplexer circuit 600, which is a 4-input asymmetric multiplexer circuit. An asymmetric multiplexer circuit is one where each stage of the circuit has unbalanced branches where one of the branches of a stage has more FET devices than the other branch of that stage. For example, in multiplexer circuit 600, each stage has two PFETs and four NFETs. A symmetric multiplexer circuit, as illustrated in FIG. 8, is one where the branches are balanced so that they have equal numbers of FET devices on each side of the clocked inverter.

Multiplexer circuit 600 outputs an output data signal, labeled as $\overline{\text{OUT}}$, on output 653 in response to receipt of input data signals IN0, . . . , IN3, received on inputs 640–643, respectively.

Input 640 is coupled to the gate electrodes of PFET 603 and NFET 604, which form a clocked inverter having an output 650 coupled to output 653. The source electrode of PFET 603 is coupled to the drain electrode of PFET 602, which has its source electrode coupled to reference voltage source 601. The gate electrode of PFET 602 receives control signal S0. The source electrode of NFET 604 is coupled to reference voltage source 608 through NFETs 605, 606, and 607, coupled in series. The gate electrodes of NFETs 605, 606, and 607 receive control signals S1, S2, and S3, respectively.

Input 641 is coupled to the gate electrodes of PFET 611 and NFET 612, which form a clocked inverter having an output 651 coupled to output 653. The source electrode of PFET 611 is coupled to the drain electrode of PFET 610, which has its source electrode coupled to reference voltage source 609. The gate electrode of PFET 610 receives control signal S1. The source electrode of NFET 612 is coupled to reference voltage source 616 through NFETs 613, 614, and 615, coupled in series. The gate electrodes of NFETs 613, 614, and 615 receive control signals S2, S3, and S0, respectively.

Input 642 is coupled to the gate electrodes of PFET 619 and NFET 620, which form a clocked inverter having an output 652 coupled to output 653. The source electrode of PFET 619 is coupled to the drain electrode of PFET 618, which has its source electrode coupled to reference voltage source 617. The gate electrode of PFET 618 receives control signal S2. The source electrode of NFET 620 is coupled to reference voltage source 632 through NFETs 621, 622, and 623, coupled in series. The gate electrodes of NFETs 621, 622, and 623 receive control signals S3, S0, and S1, respectively.

Input 643 is coupled to the gate electrodes of PFET 626 and NFET 627, which form a clocked inverter having an output 653. The source electrode of PFET 626 is coupled to the drain electrode of PFET 625, which has its source electrode coupled to reference voltage source 624. The gate electrode of PFET 625 receives control signal S3. The source electrode of NFET 627 is coupled to reference voltage source 631 through NFETs 628, 629, and 630, coupled in series. The gate electrodes of NFETs 628, 629, and 630 receive control signals S0, S1, and S2, respectively.

Note, reference voltage sources 601, 609, 617, and 624 may be coupled together, and may be coupled to a positive or negative power supply. Reference voltage sources 608, 616, 632, and 631 may also be coupled together, and may be coupled to a ground reference. Voltage sources 601, 609, 617, and 624 will have higher potentials than voltage sources 608, 616, 632, and 631.

An output on line 653 of multiplexer circuit 600 is performed by multiplexer circuit 600 in response to receipt of control signals S0, . . . , S3. These control signals S0, . . . , S3 are produced by encoder 143 in response to receipt of selection signals SEL__IN0, . . . , SEL__IN3, in accordance with the table illustrated in FIG. 7.

Alternative circuit configurations for circuit 600 may be designed. When producing the encoding table for designing such an alternative multiplexer circuit, the following rules are followed:

1. Each row contains three 1s and one 0.
2. The columns containing the designating 1s on a particular row do not all contain 1s on another particular row.
3. The column containing the designating 0 on a particular row does not contain a 0 on another row.

Referring next to FIG. 8, there is illustrated multiplexer circuit 800, which is also a 4-input multiplexer circuit, as described above with respect to FIG. 6, except that multiplexer circuit 800 is a 4-input symmetric multiplexer circuit, wherein for each stage of multiplexer circuit 800 there are two PFET devices receiving control signals and two NFET devices receiving control signals. It may be more desirable to have a N-input multiplexer circuit that is asymmetric, rather than symmetric, since it is often desirable to implement circuitry with N-channel FETs as opposed to P-channel FETs.

Multiplexer circuit 800 produces an output signal, labeled as $\overline{OUT}$, on output 853 in response to receipt of input data signals IN0, . . . , IN3, received on data inputs 840–843, respectively.

Input 840 is coupled to the gate electrodes of PFET 804 and NFET 805, which form a clocked inverter circuit having an output 850, which is coupled to output 853. PFET 804 has its source electrode coupled to the drain electrode of PFET 803, which has its source electrode coupled to the drain electrode of PFET 802, which has its source electrode coupled to reference voltage source 801. The gate electrode of PFET 802 receives control signal S0, while the gate electrode of PFET 803 receives control signal S1. The source electrode of NFET 805 is coupled to the drain electrode of NFET 806, which has its source electrode coupled to the drain electrode of NFET 807, which has its source electrode coupled to reference voltage source 808. The gate electrode of NFET 806 receives control signal S2, while the gate electrode of NFET 807 receives control signal S3.

Input 841 is coupled to the gate electrodes of PFET 812 and NFET 813, which form a clocked inverter circuit having an output 851, which is coupled to output 853. PFET 812 has its source electrode coupled to the drain electrode of PFET 811, which has its source electrode coupled to the drain electrode of PFET 810, which has its source electrode coupled to reference voltage source 809. The gate electrode of PFET 811 receives control signal S2, while the gate electrode of PFET 810 receives control signal S1. The source electrode of NFET 813 is coupled to the drain electrode of NFET 814, which has its source electrode coupled to the drain electrode of NFET 815, which has its source electrode coupled to reference voltage source 816. The gate electrode of NFET 815 receives control signal S0, while the gate electrode of NFET 814 receives control signal S2.

Input 842 is coupled to the gate electrodes of PFET 820 and NFET 821, which form a clocked inverter circuit having an output 852, which is coupled to output 853. PFET 820 has its source electrode coupled to the drain electrode of PFET 819, which has its source electrode coupled to the drain electrode of PFET 818, which has its source electrode coupled to reference voltage source 817. The gate electrode of PFET 818 receives control signal S2, while the gate electrode of PFET 819 receives control signal S3. The source electrode of NFET 821 is coupled to the drain electrode of NFET 822, which has its source electrode coupled to the drain electrode of NFET 823, which has its source electrode coupled to reference voltage source 824. The gate electrode of NFET 822 receives control signal S0, while the gate electrode of NFET 823 receives control signal S1.

Input 843 is coupled to the gate electrodes of PFET 828 and NFET 829, which form a clocked inverter circuit having an output 853. PFET 828 has its source electrode coupled to the drain electrode of PFET 827, which has its source electrode coupled to the drain electrode of PFET 826, which has its source electrode coupled to reference voltage source 825. The gate electrode of PFET 827 receives control signal S0, while the gate electrode of PFET 826 receives control signal S3. The source electrode of NFET 829 is coupled to the drain electrode of NFET 830, which has its source electrode coupled to the drain electrode of NFET 831, which has its source electrode coupled to reference voltage source 832. The gate electrode of NFET 831 receives control signal S2, while the gate electrode of NFET 830 receives control signal S1.

Reference voltage sources 801, 809, 817, and 825 may be coupled together, and may be coupled to a positive or negative power supply. Reference voltage sources 808, 816, 824, and 832 may be coupled together, and may be coupled to a ground reference. Voltage sources 801, 809, 817, and 825 will have higher potentials than voltage sources 808, 816, 824, and 832.

An output on output 853 of multiplexer circuit 800 is performed by multiplexer circuit 800 in response to receipt of control signals S0, . . . , S3. These control signals S0, . . . , S3 are produced by encoder 143 in response to receipt of selection signals SEL__IN0, . . . , SEL__IN3, in accordance with the table illustrated in FIG. 11.

Figures 12, 13:
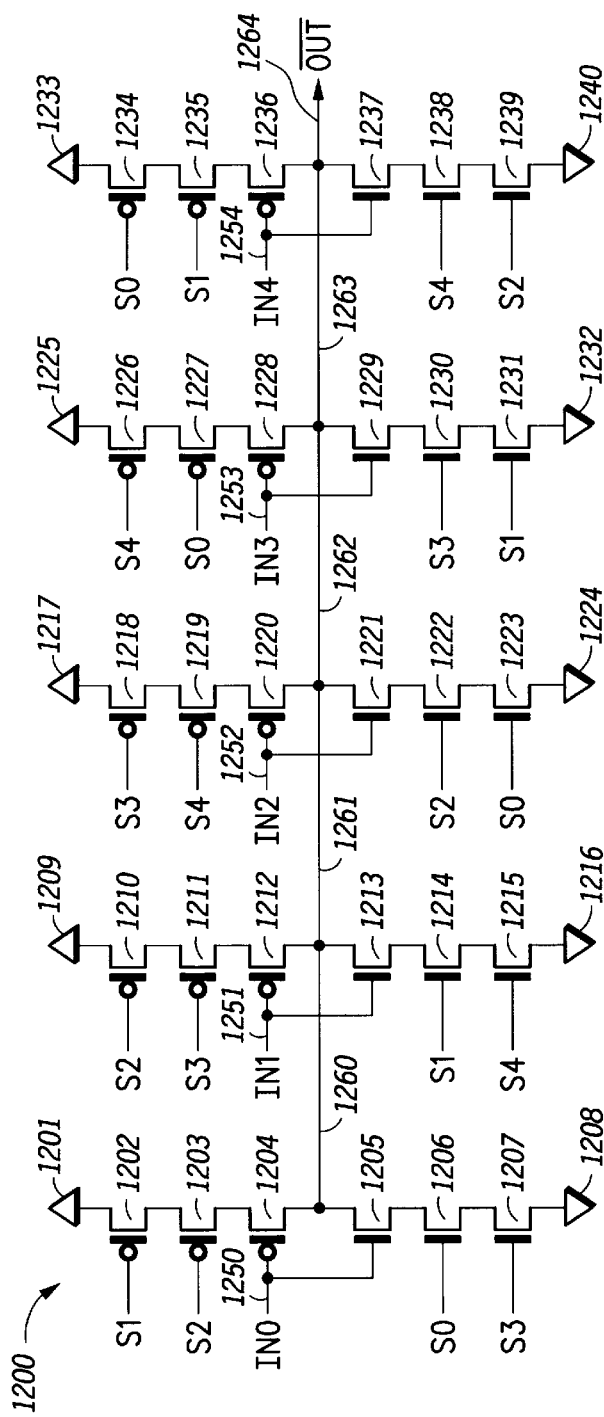
FIG. 12 illustrates a five-input multiplexer circuit in accordance with the present invention.
FIG. 13 illustrates encoding of the signals to be sent to the five-input multiplexer circuit illustrated in FIG. 12.

Referring next to FIG. 12, there is illustrated multiplexer circuit 1200, which is a 5-input multiplexer circuit.

Multiplexer circuit 1200 produces an output signal, labeled as $\overline{OUT}$, on output 1264 in response to receipt of input data signals IN0, . . . , IN4, received on data inputs 1250–1254, respectively.

Input 1250 is coupled to the gate electrodes of PFET 1204 and NFET 1205, which form a clocked inverter circuit having an output 1260, which is coupled to output 1264. PFET 1204 has its source electrode coupled to the drain electrode of PFET 1203, which has its source electrode coupled to the drain electrode of PFET 1202, which has its source electrode coupled to reference voltage source 1201. The gate electrode of PFET 1202 receives control signal S1, while the gate electrode of PFET 1203 receives control signal S2.

The source electrode of NFET 1205 is coupled to the drain electrode of NFET 1206, which has its source electrode coupled to the drain electrode of NFET 1207, which has its source electrode coupled to reference voltage source 1208. The gate electrode of NFET 1206 receives control signal S0, while the gate electrode of NFET 1207 receives control signal S3.

Input 1251 is coupled to the gate electrodes of PFET 1212 and NFET 1213, which form a clocked inverter circuit having an output 1261, which is coupled to output 1264. PFET 1212 has its source electrode coupled to the drain electrode of PFET 1211, which has its source electrode coupled to the drain electrode of PFET 1210, which has its source electrode coupled to reference voltage source 1209. The gate electrode of PFET 1210 receives control signal S2, while the gate electrode of PFET 1211 receives control signal S3.

The source electrode of NFET 1213 is coupled to the drain electrode of NFET 1214, which has its source electrode coupled to the drain electrode of NFET 1215, which has its source electrode coupled to reference voltage source 1216. The gate electrode of NFET 1214 receives control signal S1, while the gate electrode of NFET 1215 receives control signal S4.

Input 1252 is coupled to the gate electrodes of PFET 1220 and NFET 1221, which form a clocked inverter circuit having an output 1262, which is coupled to output 1264. PFET 1220 has its source electrode coupled to the drain electrode of PFET 1219, which has its source electrode coupled to the drain electrode of PFET 1218, which has its source electrode coupled to reference voltage source 1217. The gate electrode of PFET 1218 receives control signal S3, while the gate electrode of PFET 1219 receives control signal S4.

The source electrode of NFET 1221 is coupled to the drain electrode of NFET 1222, which has its source electrode coupled to the drain electrode of NFET 1223, which has its source electrode coupled to reference voltage source 1224. The gate electrode of NFET 1222 receives control signal S2, while the gate electrode of NFET 1223 receives control signal S0.

Input 1253 is coupled to the gate electrodes of PFET 1228 and NFET 1229, which form a clocked inverter circuit having an output 1263, which is coupled to output 1264. PFET 1228 has its source electrode coupled to the drain electrode of PFET 1227, which has its source electrode coupled to the drain electrode of PFET 1226, which has its source electrode coupled to reference voltage source 1225. The gate electrode of PFET 1226 receives control signal S4, while the gate electrode of PFET 1227 receives control signal S0.

The source electrode of NFET 1229 is coupled to the drain electrode of NFET 1230, which has its source electrode coupled to the drain electrode of NFET 1231, which has its source electrode coupled to reference voltage source 1232. The gate electrode of NFET 1230 receives control signal S3, while the gate electrode of NFET 1231 receives control signal S1.

Input 1254 is coupled to the gate electrodes of PFET 1236 and NFET 1237, which form a clocked inverter circuit having an output 1264. PFET 1236 has its source electrode coupled to the drain electrode of PFET 1235, which has its source electrode coupled to the drain electrode of PFET 1234, which has its source electrode coupled to reference voltage source 1233. The gate electrode of PFET 1234 receives control signal S0, while the gate electrode of PFET 1235 receives control signal S1.

The source electrode of NFET 1237 is coupled to the drain electrode of NFET 1238, which has its source electrode coupled to the drain electrode of NFET 1239, which has its source electrode coupled to reference voltage source 1240. The gate electrode of NFET 1238 receives control signal S4, while the gate electrode of NFET 1239 receives control signal S2.

Reference voltage sources 1201, 1209, 1217, 1225, and 1233 may be coupled together, and may be coupled to a positive or negative power supply. Reference voltage sources 1208, 1216, 1224, 1232, and 1240 may be coupled together, and may be coupled to a ground reference. Reference voltage sources 1201, 1209, 1217, 1225, and 1233 will have higher potentials than reference voltage sources 1208, 1216, 1224, 1232, and 1240.

An output from output 1264 of multiplexer circuit 1200 is performed by multiplexer circuit 1200 in response to receipt of control signals S0, . . . , S4. These control signals S0, . . . , S4 are produced by encoder 143 in response to receipt of selection signals SEL__IN0, . . . , SEL__IN4, in accordance with the table illustrated in FIG. 13.

The cross-hatched blocks in the table of FIG. 13 represent which encoded signals are transmitted to each stage within multiplexer circuit 1200. For example, selection signal SEL__IN3 is produced so that multiplexer circuit 1200 will output from data output 1264 a signal that is dependent upon input data signal IN3 supplied to data input 1253. For this to be accomplished, in accordance with the table in FIG. 13, encoded signals S0 and S4, corresponding to selection signal SEL__IN3, are to be sent to PFETs 1227 and 1226, respectively. Likewise, encoded signals S3 and S1 are to be sent to the gate electrodes of NFETs 1230 and 1231, respectively, as shown in FIG. 12. Since encoded signals S0 and S4 have "0" values, and since encoded values S1 and S3 have "1" values, input data signal IN3 will essentially be "selected" for output from multiplexer circuit 1200 on data output 1264.

Figures 14, 15:
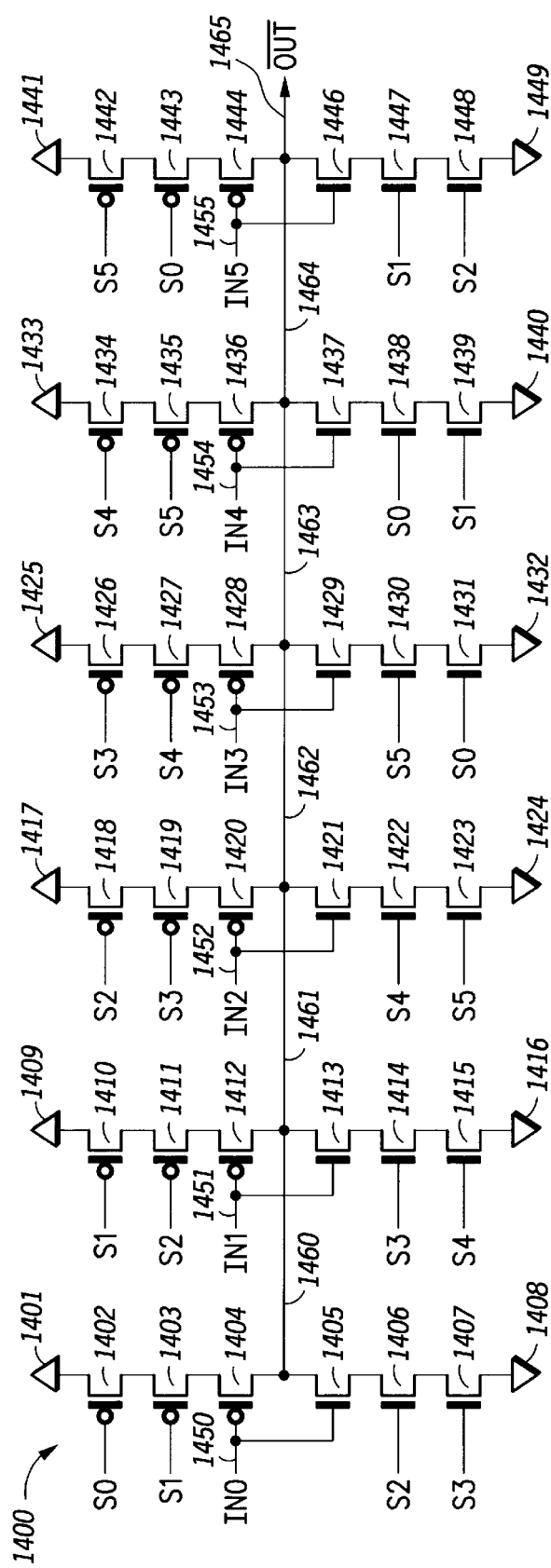
FIG. 14 illustrates a six-input multiplexer circuit in accordance with the present invention.
FIG. 15 illustrates encoding of the signals to be sent to the six-input multiplexer circuit illustrated in FIG. 14.

Referring next to FIG. 14, there is illustrated multiplexer circuit 1400, which is a 6-input multiplexer circuit.

Multiplexer circuit 1400 produces an output signal, labeled as $\overline{OUT}$, on output 1465 in response to receipt of input data signals IN0, . . . , IN5, received on data inputs 1450–1455, respectively.

Input 1450 is coupled to the gate electrodes of PFET 1404 and NFET 1405, which form a clocked inverter circuit having an output 1460, which is coupled to output 1465. PFET 1404 has its source electrode coupled to the drain electrode of PFET 1403, which has its source electrode coupled to the drain electrode of PFET 1402, which has its source electrode coupled to reference voltage source 1401. The gate electrode of PFET 1402 receives control signal S0, while the gate electrode of PFET 1403 receives control signal S1.

The source electrode of NFET 1405 is coupled to the drain electrode of NFET 1406, which has its source electrode coupled to the drain electrode of NFET 1407, which has its source electrode coupled to reference voltage source 1408. The gate electrode of NFET 1406 receives control signal S2, while the gate electrode of NFET 1407 receives control signal S3.

Input 1451 is coupled to the gate electrodes of PFET 1412 and NFET 1413, which form a clocked inverter circuit having an output 1461, which is coupled to output 1465. PFET 1412 has its source electrode coupled to the drain electrode of PFET 1411, which has its source electrode coupled to the drain electrode of PFET 1410, which has its source electrode coupled to reference voltage source 1409. The gate electrode of PFET 1410 receives control signal S1, while the gate electrode of PFET 1411 receives control signal S2.

The source electrode of NFET 1413 is coupled to the drain electrode of NFET 1414, which has its source electrode coupled to the drain electrode of NFET 1415, which has its source electrode coupled to reference voltage source 1416. The gate electrode of NFET 1414 receives control signal S3, while the gate electrode of NFET 1415 receives control signal S4.

Input 1452 is coupled to the gate electrodes of PFET 1420 and NFET 1421, which form a clocked inverter circuit having an output 1462, which is coupled to output 1465. PFET 1420 has its source electrode coupled to the drain electrode of PFET 1419, which has its source electrode coupled to the drain electrode of PFET 1418, which has its source electrode coupled to reference voltage source 1417. The gate electrode of PFET 1418 receives control signal S2, while the gate electrode of PFET 1419 receives control signal S3.

The source electrode of NFET 1421 is coupled to the drain electrode of NFET 1422, which has its source electrode coupled to the drain electrode of NFET 1423, which has its source electrode coupled to reference voltage source 1424. The gate electrode of NFET 1422 receives control signal S4, while the gate electrode of NFET 1423 receives control signal S5.

Input 1453 is coupled to the gate electrodes of PFET 1428 and NFET 1429, which form a clocked inverter circuit having an output 1463, which is coupled to output 1465. PFET 1428 has its source electrode coupled to the drain electrode of PFET 1427, which has its source electrode coupled to the drain electrode of PFET 1426, which has its source electrode coupled to reference voltage source 1425. The gate electrode of PFET 1426 receives control signal S3, while the gate electrode of PFET 1427 receives control signal S4.

The source electrode of NFET 1429 is coupled to the drain electrode of NFET 1430, which has its source electrode coupled to the drain electrode of NFET 1431, which has its source electrode coupled to reference voltage source 1432. The gate electrode of NFET 1430 receives control signal S5, while the gate electrode of NFET 1431 receives control signal S0.

Input 1454 is coupled to the gate electrodes of PFET 1436 and NFET 1437, which form a clocked inverter circuit having an output 1464, which is coupled to output 1465. PFET 1436 has its source electrode coupled to the drain electrode of PFET 1435, which has its source electrode coupled to the drain electrode of PFET 1434, which has its source electrode coupled to reference voltage source 1433. The gate electrode of PFET 1434 receives control signal S4, while the gate electrode of PFET 1435 receives control signal S5.

The source electrode of NFET 1437 is coupled to the drain electrode of NFET 1438, which has its source electrode coupled to the drain electrode of NFET 1439, which has its source electrode coupled to reference voltage source 1440. The gate electrode of NFET 1438 receives control signal S0, while the gate electrode of NFET 1439 receives control signal S1.

Input 1455 is coupled to the gate electrodes of PFET 1444 and NFET 1446, which form a clocked inverter circuit having an output 1465. PFET 1444 has its source electrode coupled to the drain electrode of PFET 1443, which has its source electrode coupled to the drain electrode of PFET 1442, which has its source electrode coupled to reference voltage source 1441. The gate electrode of PFET 1442 receives control signal S5, while the gate electrode of PFET 1443 receives control signal S0.

The source electrode of NFET 1446 is coupled to the drain electrode of NFET 1447, which has its source electrode coupled to the drain electrode of NFET 1448, which has its source electrode coupled to reference voltage source 1449. The gate electrode of NFET 1447 receives control signal S1, while the gate electrode of NFET 1448 receives control signal S2.

Reference voltage sources 1401, 1409, 1417, 1425, 1433, and 1441 may be coupled together, and may be coupled to a positive or negative power supply. Reference voltage sources 1408, 1416, 1424, 1432, 1440, and 1449 may be coupled together, and may be coupled to a ground reference. Reference voltage sources 1401, 1409, 1417, 1425, 1433, and 1441 will have higher potentials than voltage sources 1408, 1416, 1424, 1432, 1440, and 1449.

An output from output 1465 of multiplexer circuit 1400 is performed by multiplexer circuit 1400 in response to receipt of control signals S0, . . . , S5. These control signals S0, . . . , S5 are produced by encoder 143 in response to receipt of selection signals SEL_IN0, . . . , SEL_IN5, in accordance with the table illustrated in FIG. 15.

The cross-hatched blocks in the table of FIG. 15 represent which encoded signals are transmitted to each stage within multiplexer circuit 1400. For example, selection signal SEL_IN0 is produced so that multiplexer circuit 1400 will output on data output 1465 a signal that is dependent upon data input signal IN0 supplied to data input 1450. For this to be accomplished, in accordance with the table in FIG. 15, encoded signals S0 and S1, corresponding to selection signal SEL_IN0, are to be sent to PFETs 1402 and 1403, respectively. Likewise, encoded signals S2 and S3 are to be sent to the gate electrodes of NFETs 1406 and 1407, respectively, as shown in FIG. 14. Since encoded signals S0 and S1 have "0" values, and since encoded signals S2 and S3 have "1" values, data input signal IN0 will essentially be "selected" for output from multiplexer circuit 1400 on data output 1465. Note, encoded signal S4 and encoded signal S5 have values indicated as in the first row of table 6 in FIG. 15 in order that the other stages within multiplexer circuit 1400 are not activated. Therefore, one skilled in the art could design multiplexer circuit 1400 solely from viewing the table of FIG. 15.

For multiplexer circuits that have six or more inputs, a pattern can be defined. This pattern is different for even numbers of inputs as opposed to odd numbers of inputs. For multiplexer circuits where $N \geq 5$, and where N is an odd integer, the encoding for the encoded signals as a function of the selection signals is as illustrated in the table of FIG. 16. For example, when N=5, the table illustrated in FIG. 16 corresponds to the table illustrated in FIG. 15. Furthermore, the design of the multiplexer circuit to which the encoded signals are sent is dictated by the cross-hatched blocks in the table of FIG. 16 in the same manner as described above with respect to FIGS. 14 and 15. For example, for N=5, a multiplexer circuit designed using the table in FIG. 16 will have the same configuration as multiplexer circuit 1400 illustrated in FIG. 14.

Figures 18, 19:
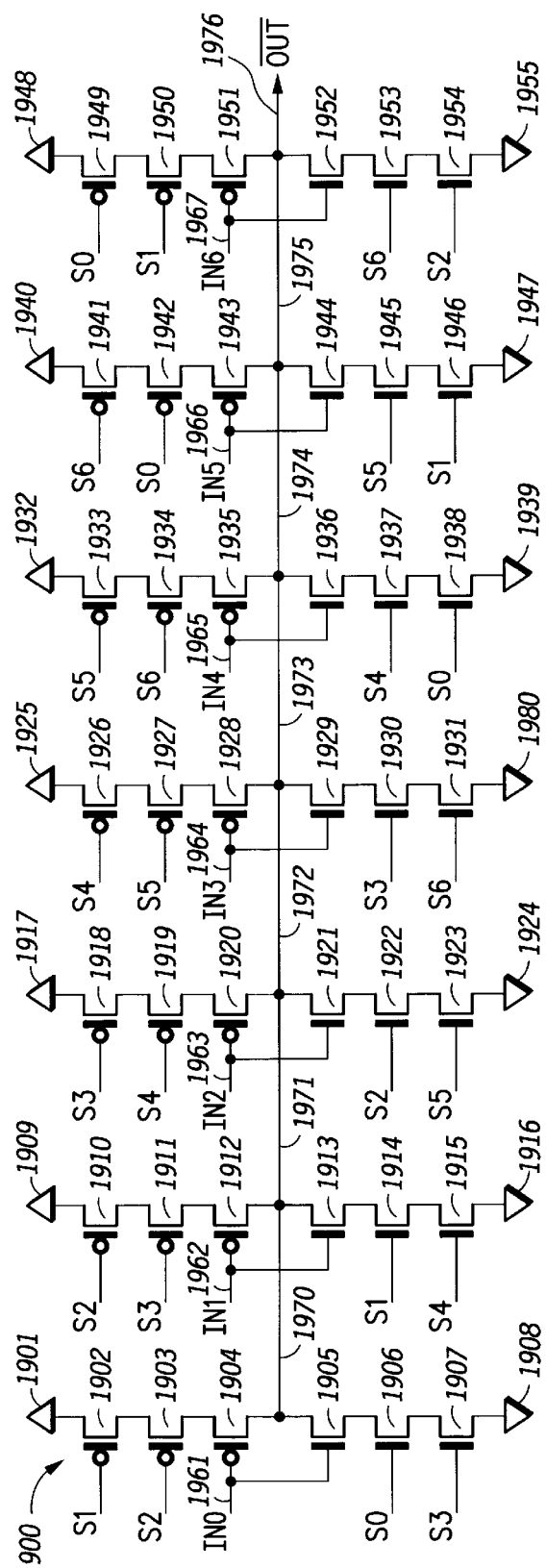
FIG. 18 illustrates encoding of control signals for the seven-input multiplexer circuit illustrated in FIG. 19.
FIG. 19 illustrates a seven-input multiplexer circuit in accordance with the present invention.

Referring next to FIG. 17, there is illustrated the encoding of the encoded signals S0, S1, . . . , S(N) as a function of selection signals SEL_IN0, SEL_IN1, . . . , SEL_IN(N) for multiplexer circuits having seven or more odd number of inputs. The encoding shown in the table of FIG. 17 is implemented in logic circuitry in encoder 143. Thus, the table illustrated in FIG. 17 is for encoding of encoded signals for a multiplexer circuit where N≧6, and where N is an even integer. For example, if N=6, then the encoding implemented within encoder 143 will be as illustrated in the table of FIG. 18.

Alternative designs may be implemented for multiplexer circuits 800, 1200, 1400, and 1900. When producing the corresponding encoding table when designing any one of these alternative circuits, the following rules are to be followed:

1. Each row contains two 1s and two 0s.
2. The columns containing the designating 1s on a particular row do not both contain 1s on another particular row.
3. The columns containing the designating 0s on a particular row do not both contain 0s on another particular row.

These rules are valid for designing alternative multiplexer circuits for a 4-input symmetric multiplexer circuit such as circuit 800, a 5-input multiplexer circuit such as circuit 1200, a 6-input multiplexer circuit such as circuit 1400, and an N-input multiplexer circuit, whether N is odd or N is even, such as described herein with respect to FIGS. 16–19.

Likewise, as described above with respect to FIG. 16, the cross-hatched blocks in the table of FIG. 17 dictate the design configuration of the multiplexer circuit corresponding with the encoding implemented in encoder 143. For example, for N=6, the design of the multiplexer circuit will be as shown in FIG. 19. FIG. 19 illustrates multiplexer circuit 1900 having seven stages for receiving seven data input signals IN0, IN1, . . ., IN6.

Referring to FIG. 19, there is illustrated 7-input multiplexer circuit 1900 in accordance with the present invention. Multiplexer circuit 1900 is comprised of a parallel connection of clocked inverters. Multiplexer circuit 1900 has seven stages for receiving seven data input signals IN0, IN1, . . . , IN6. One of these data input signals is "selected" for output onto 1976 in response to the receipt of seven control signals S0, S1, . . . , S6.

The control signals S0, S1, . . . , S6 are produced by encoding the selection signals SEL_IN0, SEL_IN1, . . . , SEL_IN6. These selection signals are the typical signals produced for prior art multiplexer circuits such as circuits 90 and 10 shown in FIGS. 9 and 10. For example, an assertion of SEL_IN1 will be produced in order to cause multiplexer circuit 1900 to "select" data input signal IN1 to be output from multiplexer circuit 1900 (the logical inverse of IN1 is output). Thus, the combinatorial logic used to produce the selection signals (see FIG. 1) does not have to be modified for implementation of multiplexer circuit 1900. However, encoder circuit 143, illustrated in FIG. 1, is required to produce control signals S0, S1, . . . , S6 as a function of the received selection signals SEL_IN0, SEL_IN1, . . . , SEL_IN6.

In multiplexer circuit 1900, data input signals IN0, IN2, . . . , IN6 are received by the seven stages of multiplexer circuit 1900 on inputs 1961–1967. Inputs 1961–1967 are coupled to the clocked inverters connected in parallel. Input 1961 is coupled to the gate electrode of PFET device 1904 and the gate electrode of NFET device 1905, which comprise the clocked inverter of the first stage of multiplexer circuit 1900. The output of this clocked inverter is coupled to data path 1970. Likewise, input 1962 is coupled to the second stage clocked inverter comprising PFET device 1912 and NFET device 1913, which has its output coupled to data path 1971. Likewise, the third stage of multiplexer circuit 1900 has a clocked inverter comprising PFET device 1920 and NFET device 1921 having their gate electrodes coupled to input 1963. The output of this clocked inverter is coupled to data path 1972. The clocked inverter of the fourth stage includes PFET device 1928 and NFET device 1929 having their gate electrodes coupled to input 1964, while the output of this clocked inverter is coupled to data path 1973. For the fifth stage of multiplexer circuit 1900, input 1965 is coupled to the gate electrodes of PFET device 1935 and NFET device 1936. This clocked inverter has its output coupled to data path 1974. The sixth stage of multiplexer circuit 1900 includes a clocked inverter comprising PFET device 1943 and NFET device 1944, having their gate electrodes coupled to input 1966. The output of this clocked inverter is coupled to data path 1975. For the seventh stage of multiplexer circuit 1900, input 1967 is coupled to the gate electrodes of PFET device 1951 and NFET device 1952. This clocked inverter has its output coupled to output 1976, which is also coupled to data paths 1970–1975.

In the first stage of multiplexer circuit 1900, the source electrode of PFET device 1904 is coupled to the drain electrode of PFET device 1903, which has its source electrode coupled to the drain electrode of PFET device 1902, which has its source electrode coupled to reference voltage source 1901. The gate electrodes of PFET devices 1902 and 1903 receive control signals S1 and S2, respectively.

The source electrode of NFET device 1905 is coupled to the drain electrode of NFET device 1906, which has its source electrode coupled to the drain electrode of NFET device 1907, which has its source electrode coupled to reference voltage source 1908. The gate electrode of NFET device 1906 receives control signal S0, while the gate electrode of NFET device 1907 receives control signal S3.

In the second stage of multiplexer circuit 1900, the source electrode of PFET device 1912 is coupled to the drain electrode of PFET device 1911, which has its source electrode coupled to the drain electrode of PFET device 1910, which has its source electrode coupled to reference voltage source 1909. The gate electrodes of PFET devices 1910 and 1911 receive control signals S2 and S3, respectively.

The source electrode of NFET device 1913 is coupled to the drain electrode of NFET device 1914, which has its source electrode coupled to the drain electrode of NFET device 1915, which has its source electrode coupled to reference voltage source 1916. The gate electrode of NFET device 1914 receives control signal S1, while the gate electrode of NFET device 1915 receives control signal S4.

In the third stage of multiplexer circuit 1900, the source electrode of PFET device 1920 is coupled to the drain electrode of PFET device 1919, which has its source electrode coupled to the drain electrode of PFET device 1918, which has its source electrode coupled to reference voltage source 1917. The gate electrodes of PFET devices 1918 and 1919 receive control signals S3 and S4, respectively.

The source electrode of NFET device 1921 is coupled to the drain electrode of NFET device 1922, which has its source electrode coupled to the drain electrode of NFET device 1923, which has its source electrode coupled to reference voltage source 1924. The gate electrode of NFET device 1922 receives control signal S2, while the gate electrode of NFET device 1923 receives control signal S5.

In the fourth stage of multiplexer circuit 1900, the source electrode of PFET device 1928 is coupled to the drain electrode of PFET device 1927, which has its source electrode coupled to the drain electrode of PFET device 1926, which has its source electrode coupled to reference voltage source 1925. The gate electrodes of PFET devices 1926 and 1927 receive control signals S4 and S5, respectively.

The source electrode of NFET 1929 is coupled to the drain electrode of NFET device 1930, which has its source electrode coupled to the drain electrode of NFET device 1931, which has its source electrode coupled to reference voltage source 1980. The gate electrode of NFET device 1930 receives control signal S3, while the gate electrode of NFET device 1931 receives control signal S6.

In the fifth stage of multiplexer circuit 1900, the source electrode of PFET device 1935 is coupled to the drain electrode of PFET device 1934, which has its source electrode coupled to the drain electrode of PFET device 1933, which has its source electrode coupled to reference voltage source 1932. The gate electrodes of PFET devices 1933 and 1934 receive control signals S5 and S6, respectively.

The source electrode of NFET device 1936 is coupled to the drain electrode of NFET device 1937, which has its source electrode coupled to the drain electrode of NFET device 1938, which has its source electrode coupled to reference voltage source 1939. The gate electrode of NFET device 1937 receives control signal S4, while the gate electrode of NFET device 1938 receives control signal S0.

In the sixth stage of multiplexer circuit 1900, the source electrode of PFET device 1943 is coupled to the drain electrode of PFET device 1942, which has its source electrode coupled to the drain electrode of PFET device 1941, which has its source electrode coupled to reference voltage source 1940. The gate electrodes of PFET devices 1941 and 1942 receive control signals S6 and S0, respectively.

The source electrode of NFET device 1944 is coupled to the drain electrode of NFET device 1945, which has its source electrode coupled to the drain electrode of NFET device 1946, which has its source electrode coupled to reference voltage source 1947. The gate electrode of NFET device 1946 receives control signal S1, while the gate electrode of NFET device 1945 receives control signal S5.

In the seventh stage of multiplexer circuit 1900, the source electrode of PFET device 1951 is coupled to the drain electrode of PFET device 1950, which has its source electrode coupled to the drain electrode of PFET device 1949, which has its source electrode coupled to reference voltage source 1948. The gate electrodes of PFET devices 1949 and 1950 receive control signals S0 and S1, respectively.

The source electrode of NFET device 1952 is coupled to the drain electrode of NFET device 1953, which has its source electrode coupled to the drain electrode of NFET device 1954, which has its source electrode coupled to reference voltage source 1955. The gate electrode of NFET device 1953 receives control signal S6, while the gate electrode of NFET device 1954 receives control signal S2.

Reference voltage sources 1901, 1909, 1917, 1925, 1932, 1940, and 1948 may all be coupled to the same reference voltage. Likewise, reference voltage sources 1908, 1916, 1924, 1980, 1939, 1947, and 1955 may all be coupled to the same reference voltage.

An output on output 1976 of multiplexer circuit 1900 is performed by multiplexer circuit 1900 in response to receipt of control signals S0, . . . , S6. These control signals S0, . . . , S6 are produced by encoder 143 in response to receipt of selection signals SEL_IN0, . . . , SEL_IN6, in accordance with the table illustrated in FIG. 18.

The cross-hatched blocks in the table of FIG. 18 represent which encoded signals are transmitted to each stage within multiplexer circuit 1900, in a similar manner as described above with respect to FIGS. 14 and 15.

Figure 20:
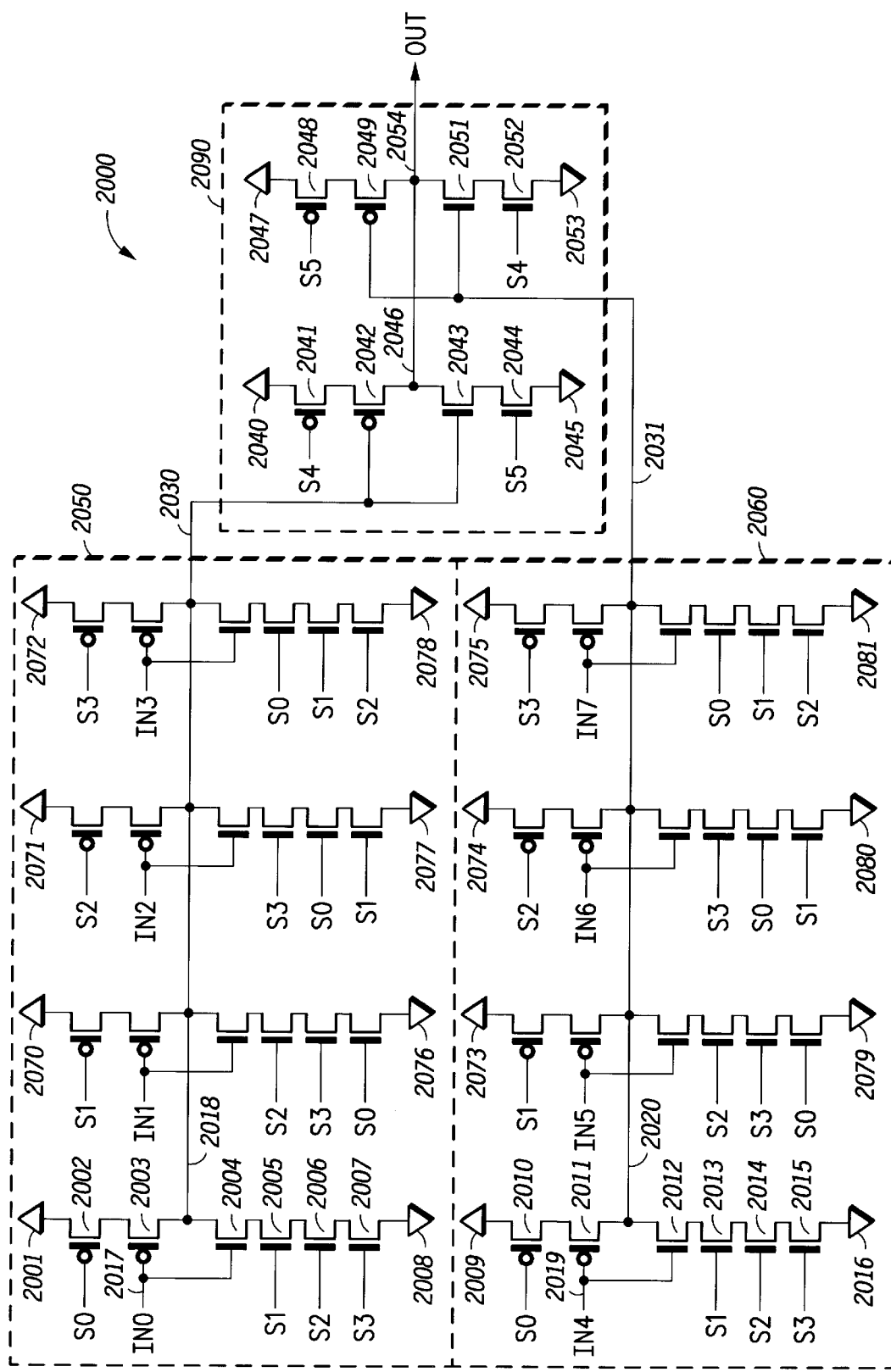
FIG. 20 illustrates an eight-input multiplexer circuit comprised of a combination of two- and four-input multiplexer circuits.

Referring next to FIG. 20, combinations of smaller multiplexers can be used to make larger multiplexers. If the single level multiplexers used to build the larger, multilevel multiplexer are of the 5-input or less design, then there is not a possibility of a shunt current occurring between power and ground.

Multiplexer circuit 2000 is comprised of two 4-input multiplexer circuits 2050 and 2060, which are both identical to multiplexer circuit 600 illustrated in FIG. 6 and are coupled to circuit 2090, which is identical to circuit 200 illustrated in FIG. 2. The output of multiplexer circuit 2050 is data output 2030, while data output 2031 is the output of multiplexer circuit 2060. Data output 2030 is coupled to the gate electrodes of the clocked inverter comprising PFET 2042 and NFET 2043, which have as their output 2046. The source electrode of PFET 2042 is coupled to the drain electrode of PFET 2041, which has its source electrode coupled to reference voltage source 2040. The gate electrode of PFET 2041 receives encoded signal S4.

The source electrode of NFET 2043 is coupled to the drain electrode of NFET 2044, which has its source electrode coupled to reference voltage source 2045. The gate electrode NFET 2044 receives encoded signal S5.

Data output 2031 is coupled to the gate electrodes of the clocked inverter comprising PFET 2049 and NFET 2051, which have as their output 2054, which is coupled to output 2046. The source electrode of PFET 2049 is coupled to the drain electrode of PFET 2048, which has its source electrode coupled to reference voltage source 2047. The gate electrode of PFET 2048 receives encoded signal S5.

The source electrode of NFET 2051 is coupled to the drain electrode of NFET 2052, which has its source electrode coupled to reference voltage source 2053. The gate electrode NFET 2052 receives encoded signal S4.

Note, reference voltage sources 2001, 2009, 2040, 2047, and 2070–2075 may be coupled together, and may be coupled to a positive or negative power supply. Additionally, reference voltage sources 2008, 2016, 2045, 2053, and 2076–2081 may be coupled together, and may be coupled to a ground reference. Reference voltage sources 2001, 2009, 2040, 2047, and 2070–2075 will have higher potentials than reference voltage sources 2008, 2016, 2045, 2053, and 2076–2081.

The output of multiplexer circuit 2000 is data output 2054 labeled as OUT.

Figures 21, 22:
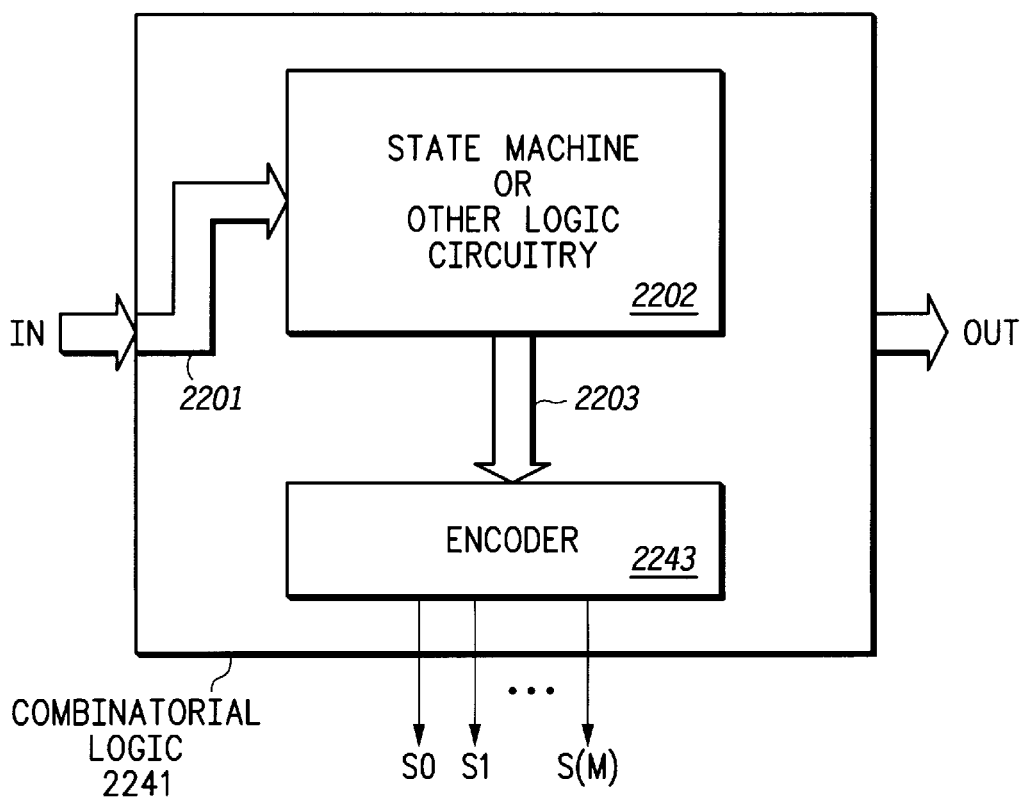
FIG. 21 illustrates encoding of the eight-input multiplexer circuit illustrated in FIG. 20.
FIG. 22 illustrates an alternative embodiment of the present invention.

Encoding of the encoded signals as a function of the selection signals is as illustrated in the table of FIG. 21. As an example of the operation of multiplexer circuit 2000 in view of the encoding illustrated in the table of FIG. 21, if combinatorial logic circuitry 141 provided to encoder 143 selection signals SEL_IN0, SEL_IN1, . . . , SEL_IN7=[1, 0,0,0,0,0,0,0], indicating that multiplexer circuit 2000 is to essentially "select" data input signal IN0 for output onto output 2054, then the data values shown in the first row of the table of FIG. 21 would be supplied to multiplexer circuit 2000. This would cause PFETs 2002 and 2010 and NFETs 2005–2007 and 2013–2015 to be turned on, thus making available to output 2018 reference voltage sources 2001 and 2008 and to output 2020 reference voltage sources 2009 and 2016, depending upon the value of data input signals IN0 and IN4, respectively. Essentially, the logical inverse of data input signal IN0 would be supplied to output 2030, while data input signal IN4 would be selected for output onto output 2031. Since encoded signal S4 has a value of "0", and encoded signal S5 has a value of "1", data input signal IN0 provided to the clocked inverter comprising PFET 2041 and NFET 2043 will be output onto data output 2054.

Another advantage of multiplexer circuit 2000 is that it allows for the encoding of the encoded signals as a function of the selection signals so that there are fewer encoded signals than there are selection signals. Referring to FIG. 1, the result of this is that M is less than N, which saves routing area with respect to lines 144 between combinatorial logic circuitry 141 and multiplexer circuit 100 within processing unit 142.

Since multiplexer circuit 2000 is a combination of previously described multiplexers (circuits 200 and 600), the table of FIG. 21 is a combination of two copies of the table in FIG. 7 and one copy of the table in FIG. 3. Cells S0–S4 by SEL__IN0–SEL__IN3 are one copy of the table illustrated in FIG. 7. Cells S0–S4 by SEL__IN4–SEL__IN7 are another copy of the table illustrated in FIG. 7. Columns S4 and S5 are similar to the table illustrated in FIG. 3 with groups of four vertically aligned cells being equivalent to each cell in the table illustrated in FIG. 3. As a result, alternative embodiments of multiplexer circuit 2000 may be configured in various ways by essentially producing alternative "subtables" of the tables illustrated in FIGS. 3 and 7 in any combination under the rules described above with respect to those tables.

Referring next to FIG. 22, there is illustrated an alternative embodiment of combinatorial logic 141, labeled as 2241. Essentially, instead of combinatorial logic 141 actually producing the selection signals SEL__IN0, . . . , SEL__IN(N), the logic circuitry for producing these signals may be combined with the circuitry of encoder 143 to directly produce the encoded signals S0, . . . , S(M). For example, a portion of the input signals into combinatorial logic circuitry 2241, labeled as IN, may be directed by bus 2201 to state machine 2202 or some other form of logic circuitry. State machine 2202 embodies selected logic circuitry (not shown) for deciding which of the various input signals IN0, . . . , IN(N), received by multiplexer circuit 100 for output on Data Out 150. When performing such an operation, state machine 2202 may produce a J-bit (j is a positive integer) coded signal, which indicates which of the input signals IN0, . . . , IN(N) to output. This J-bit signal is delivered on bus 2203 to encoder 2243, which utilizes this signal to produce encoded signals S0, . . . , S(N).

Although the present invention and its advantages have been described in detail, it should be understood that various changes, substitutions and alterations can be made herein without departing from the spirit and scope of the invention as defined by the appended claims.

I claim:

1. A digital multiplexer circuit comprising:
   circuitry operable for receiving N data signals;
   circuitry operable for generating N selection signals for selecting one of said N data signals to be output from said digital multiplexer circuit;
   an encoder operable for encoding said N selection signals into a plurality of encoded signals, wherein there are N of said plurality of encoded signals and N selection signals; and
   circuitry operable for selecting said one of said N data signals for output from said digital multiplexer circuit in response to receipt of said plurality of encoded signals, wherein N is at least one and fewer than N of said plurality of encoded signals are used by said selecting circuitry to output said one of said N data signals.

2. The digital multiplexer circuit as recited in claim 1, wherein a shunt between reference voltages coupled to said selecting circuitry is not possible when first and second selection signals are received by said encoder, and wherein both of said first and second selection signals are enabled for causing said selecting circuitry to output first and second corresponding ones of said N data signals.

3. The digital multiplexer circuit as recited in claim 1, wherein said selecting circuitry comprises N stages coupled to said circuitry operable for receiving said N data signals, and wherein two or more of said plurality of encoded signals are received by each of said N stages.

4. The digital multiplexer circuit as recited in claim 3, wherein three or more of said plurality of encoded signals are received by said each of said N stages.

5. The digital multiplexer circuit as recited in claim 3, wherein each of said plurality of encoded signals is received by more than one of said N stages.

6. The digital multiplexer circuit as recited in claim 5, wherein said one of said N stages comprises an inverter coupled to said circuitry operable for receiving N data signals, wherein an output of said inverter is coupled to an output of said digital multiplexer circuit, and wherein said inverter is coupled to a first reference voltage through at least one PFET having its gate electrode receiving a first one of said two or more of said plurality of encoded signals, and wherein said inverter is coupled to a second reference voltage through at least one NFET having its gate electrode receiving a second one of said two or more of said plurality of encoded signals.

7. The digital multiplexer circuit as recited in claim 3, wherein first and second ones of said two or more of said plurality of encoded signals are received by each of first and second ones of said N stages.

8. The digital multiplexer circuit as recited in claim 7, wherein N≧2, and
   wherein said first one of said N stages comprises a first PFET coupled between a first inverter and a first reference voltage source, and
   wherein an input of said first inverter receives a first one of said N data signals, and
   wherein a gate electrode of said first PFET receives said first one of said two or more of said plurality of encoded signals, and
   wherein said first one of said N stages comprises a first NFET coupled between said first inverter and a second reference voltage source, and
   wherein a gate electrode of said first NFET receives said second one of said two or more of said plurality of encoded signals, and
   wherein said second one of said N stages comprises a second PFET coupled between a second inverter and said first reference voltage source, and
   wherein an input of said second inverter receives a second one of said N data signals, and
   wherein a gate electrode of said second PFET receives said second one of said two or more of said plurality of encoded signals, and
   wherein said second one of said N stages comprises a second NFET coupled between said second inverter and said second reference voltage source, and wherein a gate electrode of said second NFET receives said first one of said two or more of said plurality of encoded signals, and wherein an output of said first inverter and an output of said second inverter are both coupled to an output node of said digital multiplexer circuit.

9. The digital multiplexer circuit as recited in claim 3, wherein N≧3, and wherein a first one of said N stages comprises a first PFET coupled between a first inverter and a first reference voltage source, and wherein an input of said first inverter receives a first one of said N data signals, and wherein a gate electrode of said first PFET receives a first one of said two or more of said plurality of encoded signals, and wherein said first one of said N stages comprises first and second NFETs coupled between said first inverter and a second reference voltage source, and wherein a gate electrode of said first NFET receives a second one of said two or more of said plurality of encoded signals, and wherein a gate electrode of said second NFET receives a third one of said two or more of said plurality of encoded signals, and wherein a second one of said N stages comprises a second PFET coupled between a second inverter and said first reference voltage source, and wherein an input of said second inverter receives a second one of said N data signals, and wherein a gate electrode of said second PFET receives said second one of said two or more of said plurality of encoded signals, and wherein said second one of said N stages comprises third and fourth NFETs coupled between said second inverter and said second reference voltage source, and wherein a gate electrode of said fourth NFET receives said first one of said two or more of said plurality of encoded signals, and wherein a gate electrode of said third NFET receives said third one of said two or more of said plurality of encoded signals, and wherein a third one of said N stages comprises a third PFET coupled between a third inverter and said first reference voltage source, and wherein an input of said third inverter receives a third one of said N data signals, and wherein a gate electrode of said third PFET receives said third one of said two or more of said plurality of encoded signals, and wherein said third one of said N stages comprises fifth and sixth NFETs coupled between said third inverter and said second reference voltage source, and wherein a gate electrode of said sixth NFET receives said second one of said two or more of said plurality of encoded signals, and wherein a gate electrode of said fifth NFET receives said first one of said two or more of said plurality of encoded signals, and wherein an output of said first inverter and an output of said second inverter and an output of said third inverter are all coupled to an output node of said digital multiplexer circuit.

10. The digital multiplexer circuit as recited in claim 3, wherein N≧4, and wherein a first one of said N stages comprises first and second PFETs coupled between a first inverter and a first reference voltage source, and wherein an input of said first inverter receives a first one of said N data signals, and wherein a gate electrode of said first PFET receives a first one of said two or more of said plurality of encoded signals, and wherein a gate electrode of said second PFET receives a second one of said two or more of said plurality of encoded signals, and wherein said first one of said N stages comprises first and second NFETs coupled between said first inverter and a second reference voltage source, and wherein a gate electrode of said first NFET receives a third one of said two or more of said plurality of encoded signals, and wherein a gate electrode of said second NFET receives a fourth one of said two or more of said plurality of encoded signals, and wherein a second one of said N stages comprises third and fourth PFETs coupled between a second inverter and said first reference voltage source, and wherein an input of said second inverter receives a second one of said N data signals, and wherein a gate electrode of said third PFET receives said second one of said two or more of said plurality of encoded signals, and wherein a gate electrode of said fourth PFET receives said third one of said two or more of said plurality of encoded signals, and wherein said second one of said N stages comprises third and fourth NFETs coupled between said second inverter and said second reference voltage source, and wherein a gate electrode of said fourth NFET receives said first one of said two or more of said plurality of encoded signals, and wherein a gate electrode of said third NFET receives said fourth one of said two or more of said plurality of encoded signals, and wherein a third one of said N stages comprises fifth and sixth PFETs coupled between a third inverter and said first reference voltage source, and wherein an input of said third inverter receives a third one of said N data signals, and wherein a gate electrode of said fifth PFET receives said third one of said two or more of said plurality of encoded signals, and wherein a gate electrode of said sixth PFET receives said fourth one of said two or more of said plurality of encoded signals, and wherein said third one of said N stages comprises fifth and sixth NFETs coupled between said third inverter and said second reference voltage source, and wherein a gate electrode of said sixth NFET receives said second one of said two or more of said plurality of encoded signals, and wherein a gate electrode of said fifth NFET receives said first one of said two or more of said plurality of encoded signals, and wherein a fourth one of said N stages comprises seventh and eighth PFETs coupled between a fourth inverter and said first reference voltage source, and wherein an input of said fourth inverter receives a fourth one of said N data signals, and wherein a gate electrode of said seventh PFET receives said first one of said two or more of said plurality of encoded signals, and wherein a gate electrode of said eighth PFET receives said fourth one of said two or more of said plurality of encoded signals, and wherein said fourth one of said N stages comprises seventh and eighth NFETs coupled between said fourth inverter and said second reference voltage source, and wherein a gate electrode of said seventh NFET receives said second one of said two or more of said plurality of encoded signals, and wherein a gate electrode of said eighth NFET receives said third one of said two or more of said plurality of encoded signals, and wherein an output of said first inverter and an output of said second inverter and an output of said third inverter and an output of said fourth inverter are all coupled to an output node of said digital multiplexer circuit.

11. The digital multiplexer circuit as recited in claim 4, wherein there are N of said plurality of encoded signals, and wherein a first one of said N stages receives first, second, third, and fourth ones of said N of said plurality of encoded signals, and wherein a second one of said N stages receives said second, third, and fourth ones of said N of said plurality of encoded signals and receives a fifth one of said N of said plurality of encoded signals, wherein N>4.

12. The digital multiplexer circuit as recited in claim 11, wherein N>5, and wherein a third one of said N stages receives said third, fourth, and fifth ones of said N of said plurality of encoded signals and receives a sixth one of said N of said plurality of encoded signals.

13. The digital multiplexer circuit as recited in claim 12, wherein an Nth one of said N stages receives said first, second, and third ones of said N of said plurality of encoded signals and receives an Nth one of said N of said plurality of encoded signals.

14. A digital multiplexer circuit comprising:

circuitry operable for receiving N data signals;

circuitry operable for generating one or more selection signals for selecting one of said N data signals to be output from said digital multiplexer circuit;

an encoder operable for encoding said one or more selection signals into a plurality of encoded signals; and circuitry operable for selecting said one of said N data signals for output from said digital multiplexer circuit in response to receipt of said plurality of encoded signals, wherein there are M of said plurality of encoded signals and N selection signals, wherein M<N.

15. The digital multiplexer circuit as recited in claim 14, wherein said selecting circuitry comprises:

a first section comprised of N-X stages each receiving one of N-X of said N data signals, wherein X is a positive integer less than N;

a second section comprised of X stages each receiving one of X of said N data signals, wherein stages of said first section are not coupled to stages of said second section through their output nodes; and a third section comprised of at least two stages, wherein a first one of said at least two stages receives an output of said first section, and wherein a second one of said at least two stages receives an output of said second section, and wherein outputs of said first and second ones of said at least two stages are coupled to an output of said digital multiplexer circuit, and wherein each of said stages in said first, second, and third sections receives at least two of said plurality of encoded signals.

16. An integrated circuit comprising:

a digital multiplexer having N data inputs and one data output;

combinatorial logic circuitry; and

M control lines coupling said combinatorial logic circuitry to said digital multiplexer, wherein said combinatorial logic circuitry comprises:

an encoder receiving J selection signals indicating that a data signal received by one of said N data inputs is to be output from said one data output, wherein said encoder encodes said J selection signals into M control signals to be transmitted on said M control lines to said digital multiplexer, wherein said digital multiplexer is operable to output from said one data output said data signal received by said one of said N data inputs in response to said control signals, and M is less than or equal to N and wherein fewer than N of said M control signals are used by said digital multiplexer to output said data signal.

17. The integrated circuit as recited in claim 16, wherein said digital multiplexer comprises N stages coupled to said N data inputs, wherein two or more of said M control signals are received by each of said N stages.

18. The integrated circuit as recited in claim 17, wherein each of said M control signals is received by more than one of said N stages.

19. The integrated circuit as recited in claim 17, wherein a first one of said N stages comprises a first inverter coupled to a first one of said N data inputs, wherein an output of said first inverter is coupled to said one data output of said digital multiplexer, and wherein said first inverter is coupled to a first voltage reference through a first PFET having its gate electrode receiving a first one of said two or more of said M control signals, and wherein said first inverter is coupled to a second voltage reference through a first NFET having its gate electrode receiving a second one of said two or more M control signals.

20. The integrated circuit as recited in claim 19, wherein said first inverter is coupled to said first voltage reference through a second PFET, coupled to said first PFET, having its gate electrode receiving a third one of said two or more of said M control signals, and wherein said first inverter is coupled to said second voltage reference through a second NFET, coupled to said first NFET, having its gate electrode receiving a fourth one of said two or more M control signals.

21. The integrated circuit as recited in claim 16, wherein said integrated circuit is a digital signal processor.

22. A multiplexer circuit comprising:

a first inverter comprising a first PFET and a first NFET having their gate electrodes coupled to a first data input of said multiplexer circuit, wherein drain electrodes of said first PFET and said first NFET are coupled to a data output of said multiplexer circuit;

a second PFET having its drain electrode coupled to a source electrode of said first PFET;

a third PFET having its drain electrode coupled to a source electrode of said second PFET, a source electrode of said third PFET coupled to a first reference source, a gate electrode of said third PFET coupled to a first control line, a gate electrode of said second PFET coupled to a second control line;

a second NFET having its drain electrode coupled to a source electrode of said first NFET;

a third NFET having its drain electrode coupled to a source electrode of said second NFET, a source electrode of said third NFET coupled to a second reference source, a gate electrode of said third NFET coupled to a third control line, a gate electrode of said second NFET coupled to a fourth control line;

a second inverter comprising a fourth PFET and a fourth NFET having their gate electrodes coupled to a second data input of said multiplexer circuit, wherein drain electrodes of said fourth PFET and said fourth NFET are coupled to said data output of said multiplexer circuit;

a fifth PFET having its drain electrode coupled to a source electrode of said fourth PFET;

a sixth PFET having its drain electrode coupled to a source electrode of said fifth PFET, a source electrode of said sixth PFET coupled to a third reference source, a gate electrode of said sixth PFET coupled to said second control line, a gate electrode of said fifth PFET coupled to said third control line;

a fifth NFET having its drain electrode coupled to a source electrode of said fourth NFET;

a sixth NFET having is drain electrode coupled to a source electrode of said fifth NFET, a source electrode of said sixth NFET coupled to a fourth reference source, a gate electrode of said sixth NFET coupled to a fifth control line, a gate electrode of said fifth NFET coupled to said first control line; and an encoder coupled to said first, second, third, fourth, and fifth control lines, said encoder operable for outputting N control signals over said first, second, third, fourth, and fifth control lines in response to receipt of N selection signals, wherein an assertion of a first selection signal indicates that a data signal input to said first data input will be output on said data output, and wherein an assertion of a second selection signal indicates that a data signal input to said second data input will be output on said data output, wherein said encoder outputs asserted bits on said third and fourth control lines and outputs negated bits on said first and second control lines in response to said asserted first selection signal.

* * * * *